United States Patent
Akulova et al.

(10) Patent No.: US 6,607,933 B2
(45) Date of Patent: Aug. 19, 2003

(54) DOUBLE LAYER BEAM EXPANDER FOR DEVICE-TO-FIBER COUPLING

(75) Inventors: Yuliya Anatolyevna Akulova, Goleta, CA (US); Mindaugas Fernand Dautartas, Blacksburg, VA (US); Marlin Wilbert Focht, Williams Township Northhampton County, PA (US); Kenneth Gerard Glogovsky, Kempton, PA (US); Abdallah Ougazzaden, Emmaus, PA (US); Justin Larry Peticolas, Wescosville, PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 142 days.

(21) Appl. No.: 09/923,661

(22) Filed: Aug. 7, 2001

(65) Prior Publication Data
US 2003/0031416 A1 Feb. 13, 2003

(51) Int. Cl.[7] ............................................... H01L 21/00
(52) U.S. Cl. .............................. 438/31; 438/40; 438/41; 438/29
(58) Field of Search ............................... 438/22, 31, 29, 438/39, 40, 41, 42, 43, 44, 45, 483

(56) References Cited

U.S. PATENT DOCUMENTS

| | | |
|---|---|---|
| 4,930,854 A | 6/1990 | Albares et al. |
| 5,087,109 A | 2/1992 | Ishizuka et al. |
| 5,197,110 A | 3/1993 | Chikuma et al. |
| 5,261,017 A | 11/1993 | Melman et al. |
| 5,568,579 A | 10/1996 | Okaniwa |
| 5,764,842 A | 6/1998 | Aoki et al. |
| 5,801,403 A | 9/1998 | He |
| 6,018,533 A | 1/2000 | Krivoshlykov |
| 6,023,374 A | 2/2000 | Hwang |
| 6,034,380 A * | 3/2000 | Alphonse et al. .............. 257/94 |
| 6,040,246 A * | 3/2000 | Goldstein et al. ........... 438/706 |
| 6,052,397 A | 4/2000 | Jeon et al. |
| 6,094,515 A | 7/2000 | Miki et al. |
| 6,339,606 B1 * | 1/2002 | Alphonse ..................... 372/50 |

* cited by examiner

*Primary Examiner*—Savitri Mulpuri

(57) ABSTRACT

A beam expander for providing coupling between a semiconductor optical device and an optical fiber comprises a double layer structure that may be integrated with the optical device. The first, underlying layer of the expander comprises a relatively high refractive index material (e.g., 3.34), thus providing improved coupling efficiency between the optical device and the fiber. The second, covering layer of the expander comprises a relatively low refractive index material (e.g., 3.28), for providing the large mode size desired at the fiber input. The parameters of each layer can be adjusted independently, allowing for the two criteria (coupling efficiency and mode size) to be separately optimized.

9 Claims, 3 Drawing Sheets

DOUBLE LAYER BEAM EXPANDER FOR DEVICE-TO-FIBER COUPLING

TECHNICAL FIELD

The present invention relates to a beam expander for providing coupling between a semiconductor optical device and associated optical fiber and, more particularly, to a double layer beam expander integrated with the semiconductor optical device.

BACKGROUND OF THE INVENTION

Within recent years, the number of electronic applications that employ optical devices has been rapidly increasing. Typically, optical fibers are used to carry light signals from (or to) a variety of optical devices, such as lasers, amplifiers, modulators, splitters, multiplexers/demultiplexers, routers, switches and photodetectors. As is well known, the use of optical fibers and devices leads to higher data throughputs and increased communication channel bandwidths. These higher data rates result in an ever-increasing concern for maximizing the coupling efficiency between the optical device and associated fiber. In particular, low fiber coupling efficiency of laser diodes has been a major limitation for high power single mode fiber output. In a conventional laser diode, optical confinement in the semiconductor structure is asymmetric and the propagating mode profile is elliptical in shape. Also, the mode profile of these high power diode laser sources results in large beam divergence. The stronger divergence is normally in the vertical (i.e., transverse) direction due to the strong optical confinement in the vertical direction in the layered semiconductor laser structure, as opposed to the weaker optical confinement in the horizontal (i.e., lateral) direction.

This highly divergent, elliptical laser diode output beam profile presents a difficulty when attempting to couple the light from a high power laser diode source to a single mode optical fiber. This difficulty is primarily due to the large mode mismatch between the highly divergent semiconductor laser source and the small numerical aperture optical fiber. For example, the laser spot size is typically around 1 $\mu$m, while that of a fiber core is around 10 $\mu$m. This disparity limits the coupling efficiency between these two devices to about 10%, if perfectly aligned. Thus, a high power laser diode with a circular mode profile and a narrow far-field divergence is particularly desirable for efficient fiber coupling.

A number of techniques have been developed to increase the coupling efficiency between a semiconductor laser and an optical fiber. These include modifying the shape of the fiber end (e.g., tapering, lensing) so that the modal mismatch is reduced. However, the coupling efficiency is improved at the expense of very tight alignment tolerances. Untapered fibers have also shown to perform well, but there is a need for an additional lens between the laser and a modified end face fiber, increasing the difficulty of assembly. Still another approach is to modify the laser structure so that it has a tapered output section, thus increasing the spot size in the junction plane. As a variation of this approach, a tapered waveguide may be positioned between the laser and the fiber. The tapered waveguide comprises a layer with a low refractive index and is monolithically integrated with the laser. The composition of this layer is critical, since if the effective index mismatch between the laser and the tapered waveguide is high, a significant fraction of light is reflected or lost due to scattering. Alternatively, if the refractive index of the tapered waveguide is matched with the refractive index of the laser, lateral and/or transverse variation of its thickness is necessary to achieve mode expansion. Moreover, to obtain high coupling efficiency at the waveguide joint and large mode size at the tapered waveguide output, a variation of thickness in the tapered waveguide by a factor of approximately four is required.

Thus, a need remains in the art for an arrangement for improving the coupling efficiency between a semiconductor optical device and a fiber that is relatively easy to manufacture and include in an assembly, yet provides the desired high coupling efficiency.

SUMMARY OF THE INVENTION

The need remaining in the prior art is addressed by the present invention, which relates to a beam expander for providing coupling between a semiconductor optical device and associated optical fiber and, more particularly, to a double layer beam expander integrated with the semiconductor optical device.

In accordance with the present invention, a semiconductor optical device structure is formed to include a double layer beam expander disposed at the output thereof. The beam expander comprises a first layer of high index material (e.g., InGaAsP) to provide high coupling efficiency and a second layer of low index material (e.g., $In_{1-x}Ga_xAs_yP_{1-y}$) to provide the required large mode size. In particular, the refractive index of the second layer will depend upon the values of x and y, 0<x<1 and 0<y<1, since in the extreme case InP cannot be used as a waveguiding layer. The first layer is deposited to taper away from the laser endface facet and the second layer is formed to cover the first layer. In an exemplary embodiment of the present invention for use with a laser having an emitting wavelength of 1.55 $\mu$m, the first (high birefringence) layer of the double layer beam expander may comprise InGaAsP with a refractive index of 3.34, and the second (low birefringence) layer of the double layer beam expander may comprise $In_{1-x}Ga_xAs_yP_{1-y}$ with a refractive index of 3.28.

In one exemplary method of forming the double layer beam expander of the present invention, a first mask is used to cover the optical device region and a second mask is used to define the terminating endface of the first layer, with the first layer then deposited in the region between the first and second masks. The second layer is deposited after the second mask is removed. In an alternative method of forming the double layer beam expander, a first mask is used to cover the optical device and the first layer is blanket deposited on the remaining substrate surface. A second mask is then used to cover the predefined extent of the first layer and an etch step is used to remove the exposed layer. The second mask is then removed and the second layer is deposited.

Other and further aspects of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
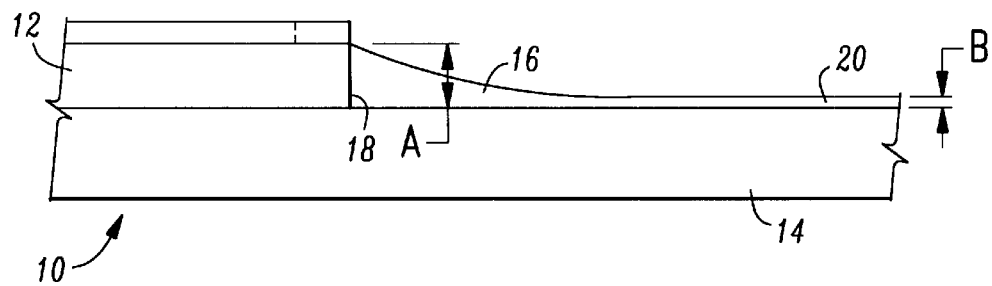
FIG. 1 illustrates a conventional beam expander arrangement.

A conventional beam expander coupling arrangement 10 typical of the prior art is illustrated in FIG. 1. As shown, a semiconductor optical device (in this example, a laser) 12 (nominally, an InP-based laser) is formed on a substrate 14, where the substrate may also comprise InP. A tapered waveguide beam expander 16 is formed as shown to extend from an output facet endface 18 of laser 12 to a predetermined termination endface 20. Although not shown in FIG. 1, a conventional optical fiber would then be coupled to terminating endface 20 of tapered waveguide beam expander 16. A low refractive index material (such as $In_{1-x}Ga_xAs_yP_{1-y}$) is typically used to form beam expander 16. The lateral variation in thickness of beam expander 16 from a maximum at laser endface 18 (denoted "A" in FIG. 1) to a minimum at terminating endface 20 (denoted "B" in FIG. 1) is necessary to achieve both sufficient coupling between the laser and the expander at the expander input and a large mode size at the expander output (that is, where the expander will couple into an optical fiber). In particular, the taper along the extent of beam expander 16 decreases its effective index (the effective index being determined by the refractive index of the material and the thickness of the waveguiding layer). To obtain a high coupling efficiency at laser endface 18 and large mode size at terminating endface 20, a thickness ratio (A/B) of approximately four is required. Such a thickness ratio (also referred to hereinafter as a "thickness enhancement ratio") is considered to be relatively large for current integrated optic applications and will become even more problematic as device sizes continue to shrink.

Figure 2:
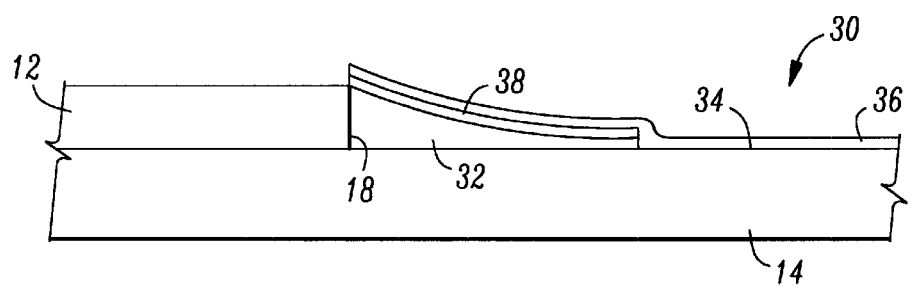
FIG. 2 illustrates a double layer beam expander formed in accordance with an embodiment of the present invention.

FIG. 2 illustrates an exemplary double layer beam expander 30 formed in accordance with the present invention. As will be discussed in detail below, beam expander 30 comprises a first layer 32 of relatively high refractive index material (e.g., InGaAsP, with, for example an index of 3.34) that serves to provide improved coupling efficiency with laser 12 at endface 18. A second layer 34 of beam expander 30 comprises a relatively low refractive index material (e.g., $In_{1-x}Ga_xAs_yP_{1-y}$ (0<x<1, 0<y<1) and comprising a different composition than first layer 32 with, for example, an index of 3.28) so as to provide improved mode coupling (i.e., large mode size) between terminating endface 36 of beam expander 30 and an optical fiber (not shown). An additional InP layer 38 may be formed between first layer 32 and second layer 34 to provide for lattice matching between the layers.

An advantage of the double layer expander of the present invention is that the characteristics of each layer can be individually tailored to accommodate the different expander requirements. For example, since high index layer 32 no longer needs to also provide large mode size, the thickness enhancement ratio (A/B) of this layer can be reduced to a factor of two or three, which is much easier to obtain and control in manufacture. The capability of using a relatively high index material without having to worry about the eventual mode size of the guided beam allows for increased coupling efficiency between the laser and the beam expander over conventional arrangements such as that illustrated in FIG. 1. Additionally, the use of a separate layer to improve the mode coupling to the output fiber allows for a relatively low index material to be used (matching that of the fiber, for example) without needing to be concerned with the coupling efficiency at the laser output.

Figure 3:
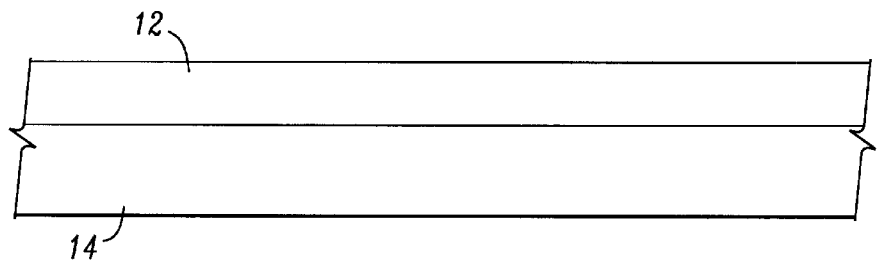
FIGS. 3–7 illustrate an exemplary process of forming the double layer beam expander of FIG. 2.
Figure 4:
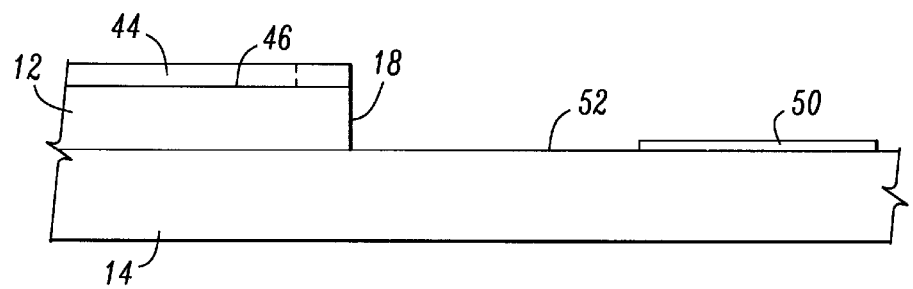
Figure 5:
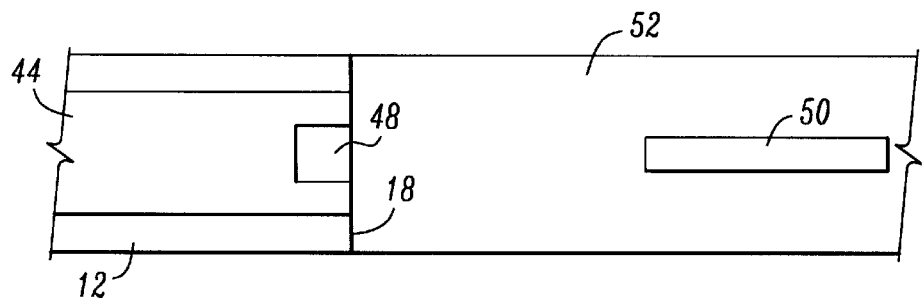

An exemplary process of forming a double layer beam expander will be now be described in detail. Referring to FIG. 3, a conventional laser structure 12 is first grown on substrate 14, where laser 12 comprises successive layers of different InP-based materials and dopants so as to form separate cladding layers and an active region (not shown), where the active region is used to generate the light output from the device. After laser structure 12 is formed, a first mask 44 is disposed on top surface 46 of structure 12 so as to cover the extent of the final laser device and define endface 18 of laser 12. FIG. 4 illustrates the placement of first mask 44 on top surface 46, subsequent to the removal of the extraneous laser material using a conventional etchant (such as bromine ethanol, or a suitable dry etch). A top view of this arrangement is illustrated in FIG. 5. Referring back to FIG. 4, once the extraneous laser material is removed by etching, a second mask 50 is disposed on surface 52 of substrate 14, where second mask 50 is used to define the termination of the double layer expander upon formation. The dimensions of second mask 50 are roughly as shown in FIGS. 4 and 5, where second mask 50 is shown as relatively narrow and centered with respect to first mask 44. The dimensions of opening 48 in first mask 44 are not considered critical.

Figure 6:
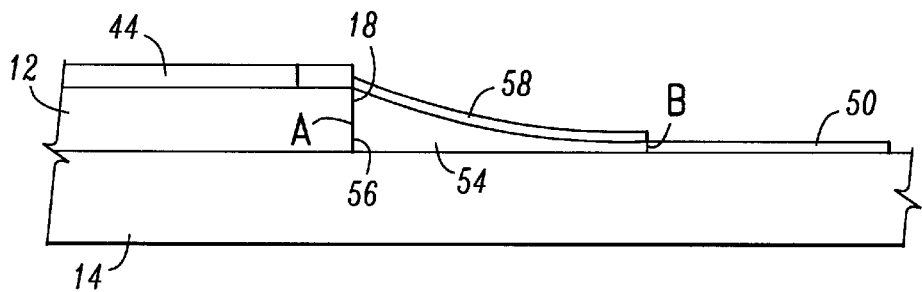

Once second mask 50 is in place, a first layer 54 of an exemplary double expander is formed, as shown in FIG. 6. First layer 54 comprises a material exhibiting a relatively high refractive index (for example, InGaAsP, refractive index of 3.34) and is formed using a selective area growth (SAG) technique so as to comprise a tapered profile as shown. In contrast to the prior art, the taper does not have to be extreme and exhibits a thickness enhancement factor (A/B) on the order of two or three. The SAG technique allows for first layer 54 to form only in the region between first mask 44 and second mask 50 and be tapered such that a first vertical sidewall 56 of first layer 54 will coincide with endface 18 of laser 12 and will extend upward to the junction of endface 18 and first mask 44. A relatively thin index-matching layer 58 is then deposited to cover first layer 54. FIG. 6 illustrates the expander structure at this point in the process.

Subsequent to the formation of index-matching layer 58, second mask 50 is removed and second expander layer 60 is grown to conformally coat both underlying index-matching layer 58 and the exposed surface 52 of substrate 14. As discussed above, second expander layer 60 comprises a relatively low refractive index material (e.g., index of 3.28), such as $In_{1-x}Ga_xAs_yP_{1-y}$, (0<x<1, 0<y<1) and is used to provide mode matching (i.e., large mode size) between laser structure 12 and an optical fiber (not shown).

Figure 8:
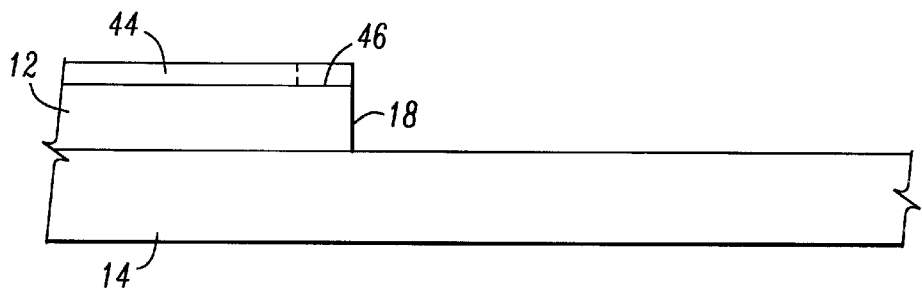
FIGS. 8–12 illustrate an alternative process of forming a double layer beam expander in accordance with the present invention.
Figure 9:
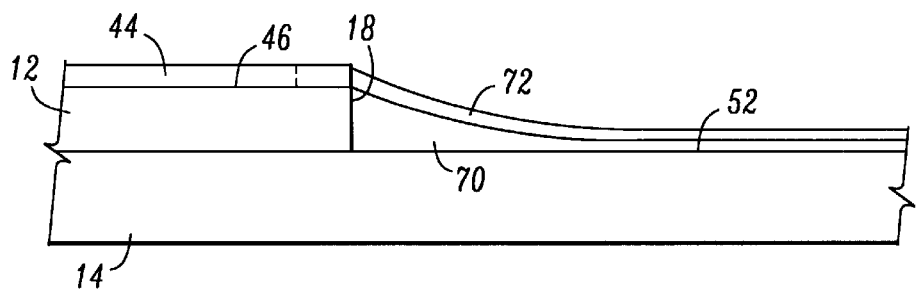

An alternative processing sequence of forming a double layer beam expander in accordance with the present invention is illustrated in FIGS. 8–12. This process begins with the same steps as discussed above in association with FIGS. 3 and 4, obtaining a structure as shown in FIG. 8. However, instead of depositing a second mask layer on this structure, a selective area growth (SAG) process is used to form a first beam expander layer 70, as shown in FIG. 9, where first beam expander layer 70 tapers away from endface 18 of laser 12 and extends in the lateral direction across top major surface 52 of substrate 14. A relatively thin InP layer 72 is then deposited to cover first beam expander layer 70. As shown in FIG. 9, first mask 44 remains in place to prevent first beam expander layer 70 from contacting the laser structure. In accordance with the present invention, first beam expander layer 70 comprises a material (e.g., InGaAsP) that exhibits a relatively high index of refraction (e.g., 1.3 μm), in order to achieve high coupling efficiency between laser 12 and the beam expander region.

Figure 7:
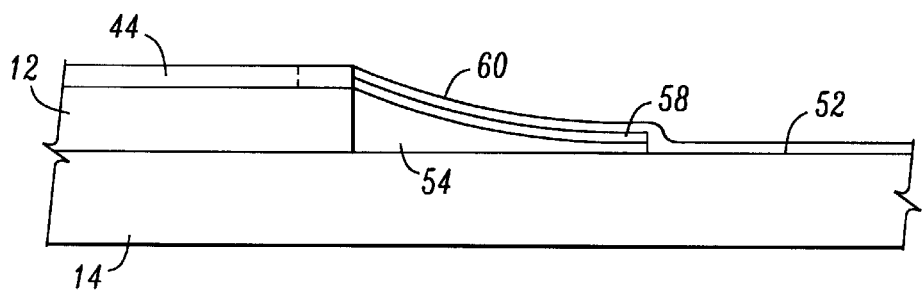
Figure 10:
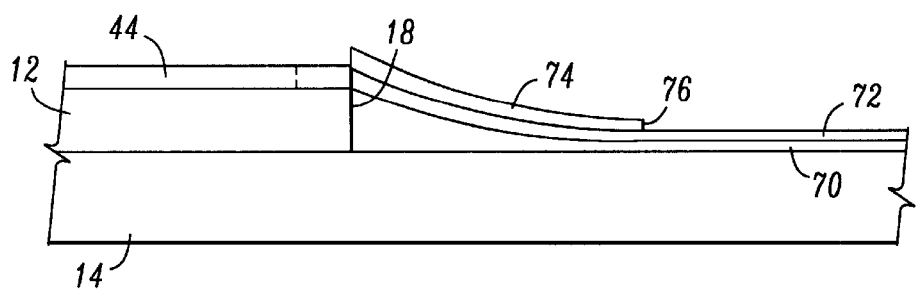
Figure 11:
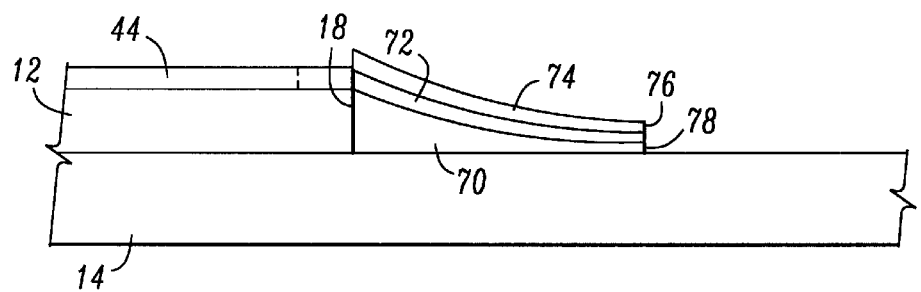
Figure 12:
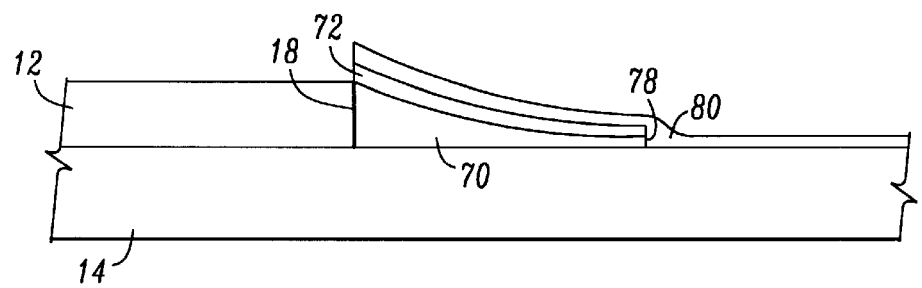

Once layers 70 and 72 are formed, a second mask 74 is disposed as shown in FIG. 10 to cover the area that will be used to define the final beam expander terminations. That is, second mask 74 is disposed to extend from the termination of first mask 44 to a predetermined location 76 that is defined as the output of the double layer beam expander. With second mask 74 in place, the exposed portions of high refractive index layer 70 and InP layer 72 are removed, using an appropriate etchant, resulting in the structure as illustrated in FIG. 11, where edge 76 of second mask 74 now defines a terminating endface 78 of first beam expander layer 70. After the layer material is removed by etching, second mask 74 is also removed, and a blanket deposition process is performed to cover the exposed structure with a layer 80 of relatively low refractive index material (e.g., $In_{1-x}Ga_xAs_yP_{1-y}$, $0<x<1$, $0<y<1$, index of 3.28) as the second layer in the double layer beam expander. FIG. 12 illustrates this structure, which is essentially identical to that illustrated in FIG. 7, formed using the latter process described above in association with FIGS. 3–7.

In general, there exist a variety of different process sequences that may be used to form the double layer beam expander arrangement of the present invention. Moreover, other materials can be used to form each layer, as long as each layer separately achieves the purposes of: (1) high coupling efficiency and (2) mode matching to the fiber.

Although the above discussion describes the formation of a double layer beam expander in association with a semiconductor laser device, it is to be understood that the double layer beam expander of the present invention is suitable for use with any emitting or receiving semiconductor optical device including, but not limited to, modulators, amplifiers, photodetectors, and the like. Indeed, the subject matter of the present invention is considered to be limited only by the scope of claims appended hereto.

What is claimed is:

1. A method of forming an optical device including a double layer beam expander for providing coupling between a semiconductor optical device and an optical fiber, the method comprising the steps of:

a) forming a semiconductor optical device including an endface facet on a top major surface of a provided substrate;

b) masking said optical device;

c) growing a first layer of a high refractive index material on said top major surface of said substrate, said first layer grown to be contiguous with the optical device endface and laterally taper away therefrom to a predetermined beam expander termination point, the thickness of said grown first layer at the optical device being a maximum ("A") and the thickness of said grown first layer at the expander termination point being a minimum ("B");

d) depositing an index-matching layer to cover the top surface of the first layer; and e) growing a second layer of a low refractive index material to cover said first layer of a high refractive index material and the index-matching layer.

2. The method as defined in claim 1 wherein in performing step c), the first layer is grown using a selective area growth (SAG) process.

3. The method as defined in claim 1 wherein in performing step c), the first layer is grown to exhibit a thickness enhancement ratio (A/B) between the values of two and three.

4. The method as defined in claim 1 wherein in performing step c), a first layer of InGaAsP is grown.

5. The method as defined in claim 4 wherein in performing step c), the first layer of InGaAsP exhibits an index of refraction of approximately 3.34.

6. The method as defined in claim 1 wherein in performing step d), a second layer of $In_{1-x}Ga_xAs_yP_{1-y}$ is grown, where $0<x<1$, $0<y<1$, and said second layer is different in composition than the first layer.

7. The method as defined in claim 6 wherein in performing step d), the second layer of $In_{1-x}Ga_xAs_yP_{1-y}$ exhibits an index of refraction of approximately 3.28.

8. The method as defined in claim 1 wherein in performing steps c) through e) the following steps are performed:

1) masking the top major surface of the substrate in a region of fiber coupling to define the endpoint termination of the beam expander;

2) growing the first layer on said substrate top major surface in the exposed region between the masked optical device and the masked substrate;

3) growing an index-matching layer over said first layer in the exposed region between the masked optical device and the masked substrate;

4) removing the mask material from the substrate; and 5) growing the second layer on the index-matching layer and exposed substrate.

9. The method as defined in claim 1 wherein in performing steps c) through e) the method comprises the further steps of:

1) growing the first layer on the exposed substrate;

2) growing the index-matching layer on the grown first layer;

3) masking said first layer and index-matching layer to cover a predefined region associated with the location of the beam expander;

4) removing the exposed first layer and index-matching layer material to expose the underlying top major surface of the substrate;

5) removing the mask layer formed in step 3); and 6) growing the second layer on the index-matching layer and exposed substrate.

* * * * *